US012607655B2

(12) United States Patent
Kawaguchi et al.

(10) Patent No.: US 12,607,655 B2
(45) Date of Patent: Apr. 21, 2026

(54) CURRENT SENSOR

(71) Applicant: Yazaki Corporation, Tokyo (JP)

(72) Inventors: Yasunori Kawaguchi, Makinohara (JP);
Shintaro Nakajima, Makinohara (JP)

(73) Assignee: YAZAKI CORPORATION, Tokyo
(JP)

( * ) Notice: Subject to any disclaimer, the term of this
patent is extended or adjusted under 35
U.S.C. 154(b) by 160 days.

(21) Appl. No.: 18/611,818

(22) Filed: Mar. 21, 2024

(65) Prior Publication Data

US 2024/0345139 A1      Oct. 17, 2024

(30) Foreign Application Priority Data

Apr. 17, 2023    (JP) ................................. 2023-067033

(51) Int. Cl.
*G01R 19/00* (2006.01)
*G01R 1/20* (2006.01)
*H05K 1/02* (2006.01)
(52) U.S. Cl.
CPC ......... *G01R 19/0092* (2013.01); *G01R 1/203*
(2013.01); *H05K 1/0296* (2013.01)
(58) Field of Classification Search
None
See application file for complete search history.

(56) References Cited

U.S. PATENT DOCUMENTS

2019/0162757 A1*  5/2019  Miyajima ............ G01R 31/364
2022/0050127 A1   2/2022  Kikuchi et al.

FOREIGN PATENT DOCUMENTS

JP          2020-30154 A     2/2020

* cited by examiner

*Primary Examiner* — Jas A Sanghera
(74) *Attorney, Agent, or Firm* — Sughrue Mion, PLLC

(57) ABSTRACT

A current sensor includes a circuit board, a shunt resistor-integrated busbar including two busbar portions and a shunt resistor portion connected between the two busbar portions, electrical connection portions for electrically connecting conductive traces arranged on the circuit board and the busbar portions, and a fixing portion for fixing the circuit board to the shunt resistor-integrated busbar, wherein where a longitudinal direction of the shunt resistor-integrated busbar is defined as an X axis direction, and a width direction of the shunt resistor-integrated busbar is defined as a Y axis direction, the fixing portion includes, on each of the two busbar portions, a first portion extending in the Y axis direction, and a pair of second portions extending toward the shunt resistor portion from both ends, in the Y axis direction, of the first portion, and wherein the electrical connection portions are arranged between the second portions constituting the pair.

10 Claims, 11 Drawing Sheets

CURRENT SENSOR

TECHNICAL FIELD

The present invention relates to a current sensor.

BACKGROUND

A shunt-type current sensor using a shunt resistor-integrated busbar has been developed (for example, Patent Document 1). The shunt resistor-integrated bus is a busbar in which a shunt resistor portion 122 is connected between two busbar portions 121, as illustrated in FIG. 2.

RELATED ART

Patent Document

Patent Document 1: JP 2020-30154 A

SUMMARY OF THE INVENTION

Problem to be Solved by the Invention

In the shunt type current sensor disclosed in the Patent Document 1, a shunt resistor-integrated busbar is fixed to a circuit board using bolts and nuts. Therefore, manufacturing costs are high and assembly is complicated.

Therefore, it is an object of the present invention to fix the busbar and the circuit board with a simple and inexpensive configuration.

Solution to Problem

In order to solve the above problem, a current sensor according to an embodiment of the present invention includes: a circuit board; a shunt resistor-integrated busbar including two busbar portions and a shunt resistor portion connected between the two busbar portions; electrical connection portions for electrically connecting conductive traces arranged on the circuit board and the busbar portions; and a fixing portion for fixing the circuit board to the shunt resistor-integrated busbar, wherein where a longitudinal direction of the shunt resistor-integrated busbar is defined as an X axis direction, and a width direction of the shunt resistor-integrated busbar is defined as a Y axis direction, the fixing portion includes, on each of the two busbar portions: a first portion extending in the Y axis direction; and a pair of second portions extending toward the shunt resistor portion from both ends, in the Y axis direction, of the first portion, and wherein the electrical connection portions are arranged between the second portions constituting the pair.

Advantageous Effects of the Invention

According to the present invention, the busbar and the circuit board can be fixed with a simple and inexpensive configuration.

BRIEF DESCRIPTION OF THE DRAWINGS

FIG. 3 is a view for explaining electrical connection portions 130 and fixing portions 140.

FIG. 9 is a view for explaining another example of the current sensor 100.

DETAILED DESCRIPTION OF THE EXEMPLARY EMBODIMENT

<Current Sensor 100>

Figure 1:
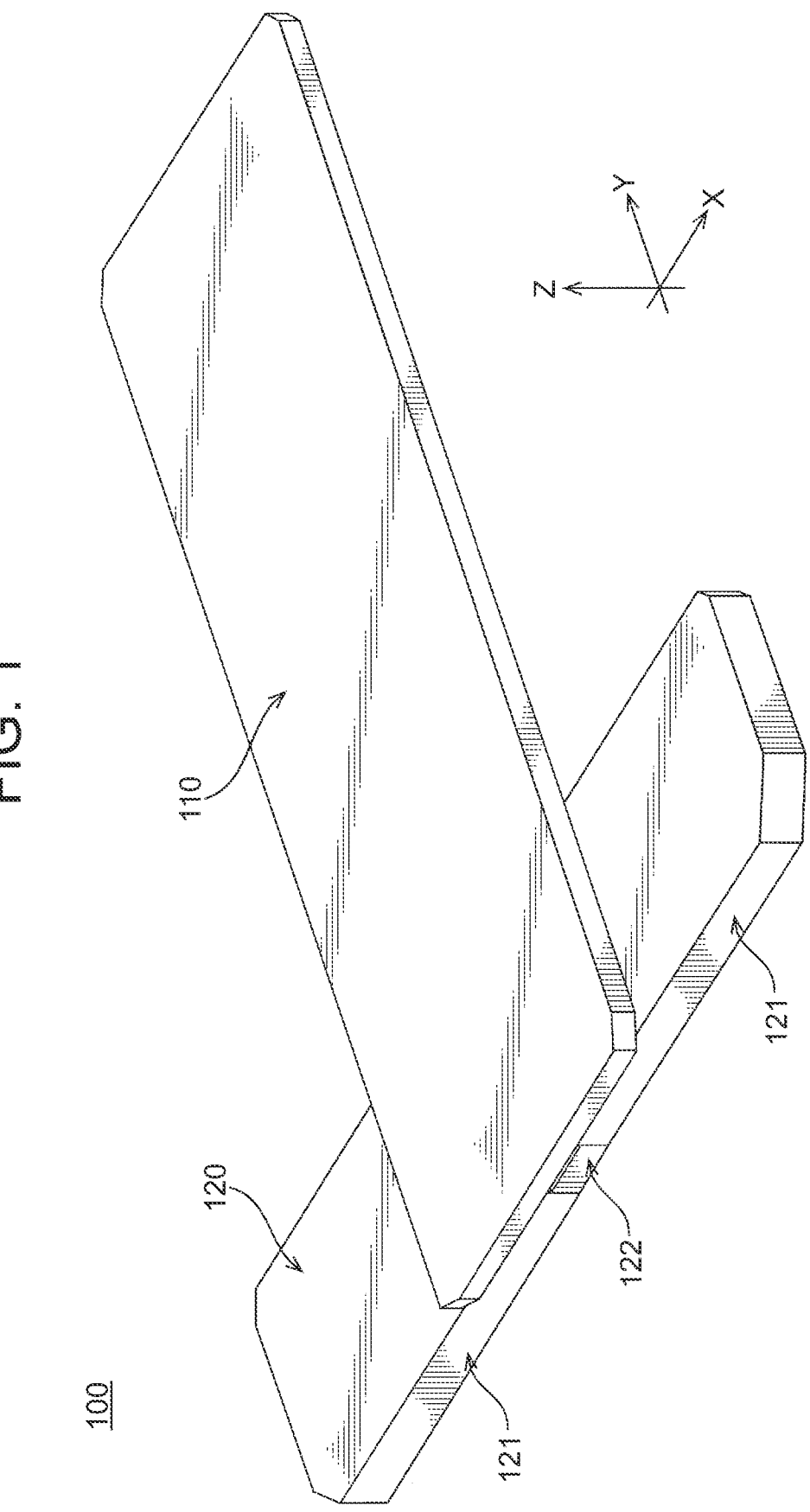
FIG. 1 is a view illustrating a current sensor 100 according to an embodiment of the present invention.

FIG. 1 is a view illustrating a current sensor 100 according to an embodiment of the present invention. The current sensor 100 includes a circuit board 110 and a shunt resistor-integrated busbar 120. In the present embodiment, the longitudinal direction of the shunt resistor-integrated busbar 120 is defined as an X axis direction, the width direction of the shunt resistor-integrated busbar 120 is defined as a Y axis direction, and a direction perpendicular to the longitudinal direction and the width direction of the shunt resistor-integrated busbar 120 is defined as a Z axis direction.

The circuit board 110 is made of, for example, an insulator. Conductive traces and electronic components are arranged on the circuit board 110. Conductive traces and electronic components may be arranged on both sides of circuit board 110, or may be arranged only on one side of circuit board 110. In FIG. 1, illustrations of electronic components and conductive traces are omitted.

Figure 2:
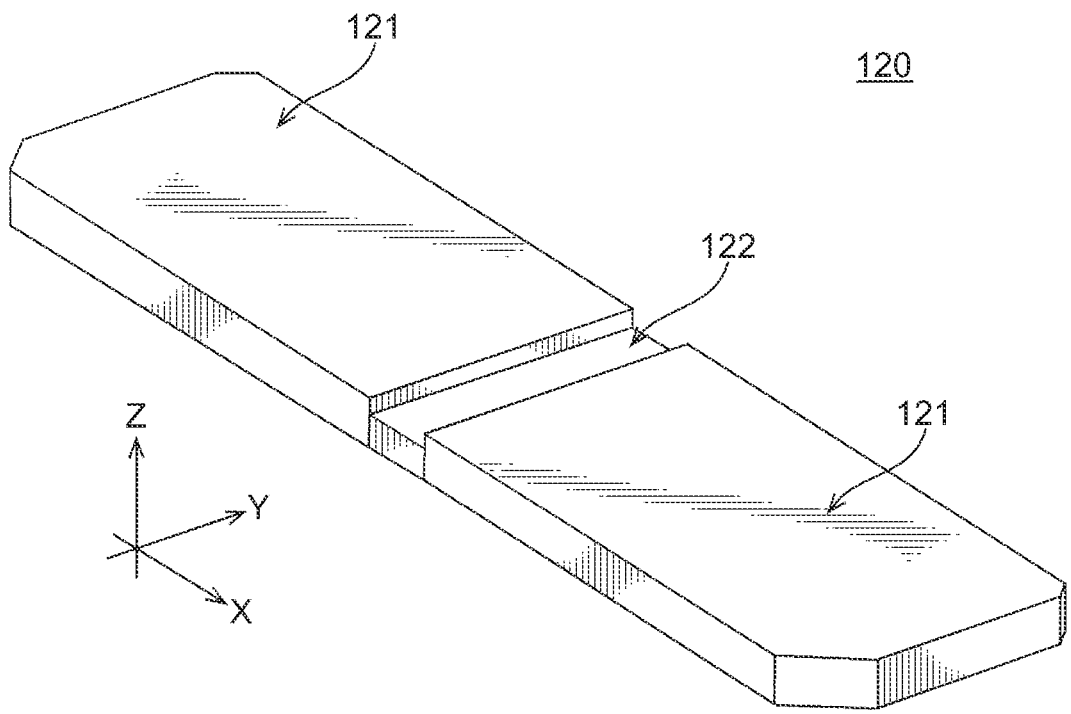
FIG. 2 is a view illustrating a shunt resistor-integrated busbar 120.

FIG. 2 is a view illustrating a shunt resistor-integrated busbar 120. The shunt resistor-integrated busbar 120 includes two busbar portions 121 and a shunt resistor portion 122. The shunt resistor portion 112 is connected between the two busbar portions 121. For example, as illustrated in FIG. 1, the circuit board 110 is arranged to cover portions of the two busbar portions 121 and the shunt resistor portion 122. In the present embodiment, one of the two surfaces of the circuit board 110 on the side of the shunt resistor-integrated busbar 120 is referred to as a lower surface, and the other of the two surfaces is referred to as an upper surface.

The busbar portion 121 is made of, for example, an electrical conductor. The shunt resistor portion 122 is a shunt resistor.

Figure 3:
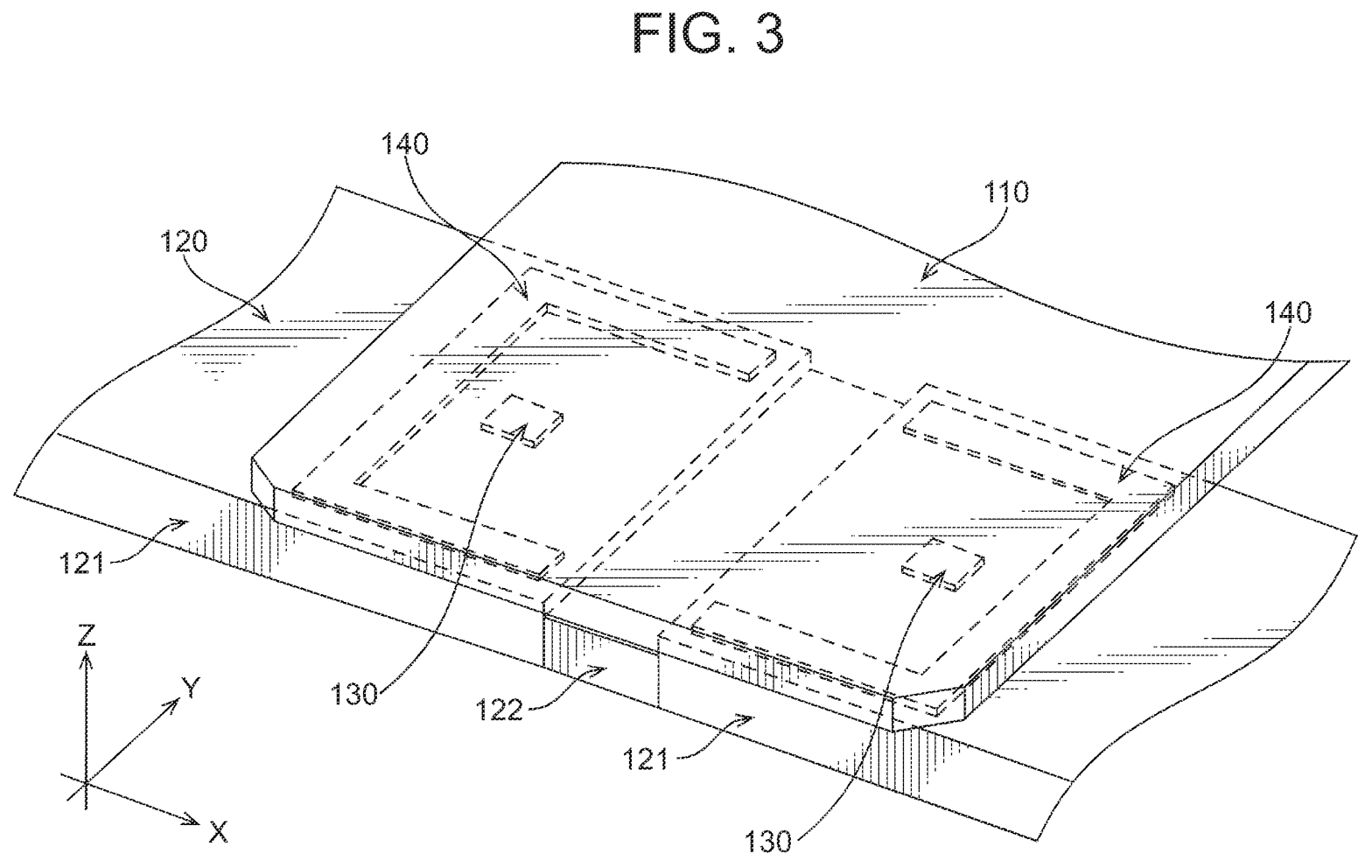

As illustrated in FIG. 3, the current sensor 100 further includes electrical connection portions 130 for electrical connection between the conductive traces and electronic components arranged on the circuit board 110 and the busbar portions 121 of the shunt resistor-integrated busbar 120. The electrical connection portions 130 are arranged between conductive traces (not illustrated) arranged on the lower surface of the circuit board 110 and the busbar portions 121 of the shunt resistor-integrated busbar 120, and are configured to electrically connect the conductive traces and electronic components arranged on the circuit board 110 and the busbar portions 121 of the shunt resistor-integrated busbar 120. In the example as illustrated in FIG. 3, one electrical connection portion 130 is provided for each busbar portion 121, but multiple electrical connection portions 130 may be provided for each busbar portion 121.

As illustrated in FIG. 3, the current sensor 100 further includes fixing portions 140 for fixing the circuit board 110 to the shunt resistor-integrated busbar 120. The fixing portions 140 are arranged between the circuit board 110 and the shunt resistor-integrated busbar 120 (especially, the busbar portions 121), and are configured to fix the busbar portions 121 of the shunt resistor-integrated busbar 120 to the circuit board 110. The material of the fixing portions 140 is, for example, solder. In this case, it is preferable that the circuit board 110 has fixing patterns to which solders constituting the fixing portions 140 are attached. The fixing patterns are placed on the lower surface of the circuit board 110. Then, the shunt resistor-integrated busbar 120 may be fixed to the circuit board 110 by soldering the fixing patterns of the circuit board 110 and the busbar portions 121 of the shunt resistor-integrated busbar 120.

Figure 4:
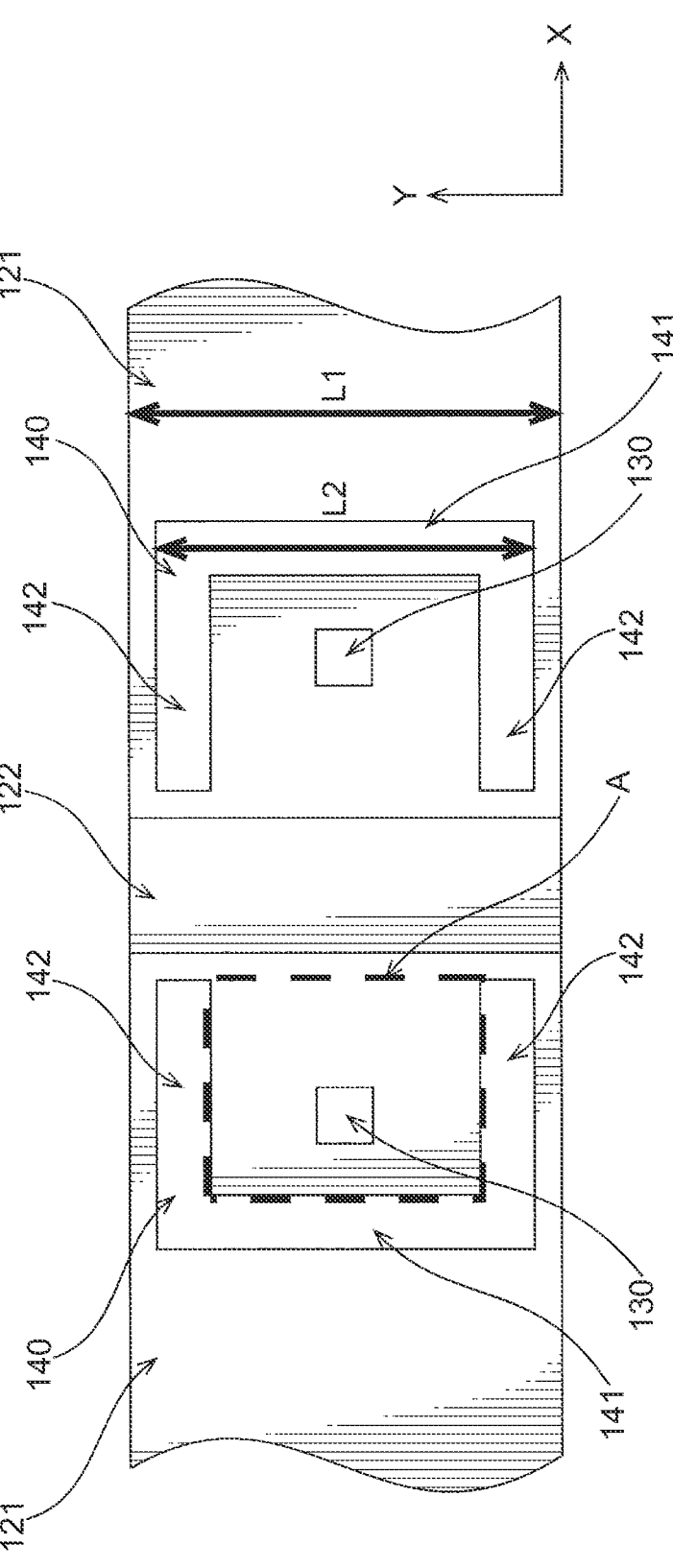
FIG. 4 is a view for explaining an arrangement of the shunt resistor-integrated busbar 120, the electrical connection portions 130, and the fixing portions 140.

FIG. 4 is a view for explaining an arrangement of the shunt resistor-integrated busbar 120, the electrical connection portions 130, and the fixing portions 140. The electrical connection portion 130 and the fixing portion 140 are arranged on each of the two busbar portions 121 of the shunt resistor-integrated busbar 120.

As illustrated in FIG. 4, on each of the two busbar portions 121, the fixing portion 140 includes a first portion 141 and a pair of second portions 142. As illustrated in FIG. 4, the first portion 141 is a portion extending in the Y axis direction. The second portion 142 is a portion extending toward the shunt resistor portion 122 from both ends of the first portion 141 in the Y axis direction. For example, as illustrated in FIG. 4, the second portion 142 may extend parallel to the X axis direction. In the example illustrated in FIG. 4, on each of the two busbar portions 121, the fixing portion 140 is in a U shape. For example, as illustrated in FIG. 3, the fixing portion 140 is arranged along an outer periphery of an area in which the circuit board 110 and the shunt resistor-integrated busbar 120 overlaps. In the example illustrated in FIGS. 3 and 4, on each of the two busbar portions 121, the fixing portion 140 is made of an integral member, but the fixing portion 140 may be made of a plurality of divided portions.

As illustrated in FIG. 4, on each of the two busbar portions 121, the electrical connection portion 130 is arranged between the second portions 142, constituting a pair, of the fixing portion 140. In other words, the electrical connection portion 130 is arranged inside an area A surrounded by the fixing portion (i.e., the first portion 141 and the pair of second portions).

Therefore, in the present embodiment, stress is concentrated on the fixing portion 140 arranged to surround the electrical connection portion 130, and stress is hardly applied to the electrical connection portion 130, so that the chance of detachment of the electrical connection portion 130 from the busbar 120 can be reduced. As a result, in the present embodiment, electrical connection abnormalities are less likely to occur. Therefore, in the present embodiment, the busbar and the circuit board can be fixed without using bolts or nuts, while maintaining high continuity reliability between the busbar and circuit board. Therefore, in the present embodiment, the busbar and the circuit board can be fixed with a simple and inexpensive configuration.

Furthermore, in the present embodiment, the fixing portion 140 is detached before the electrical connection portion 130. That is, in the present embodiment, the fixing portion 140 is detached before the electrical connection portion 130 causes a connection failure. Therefore, in the present embodiment, by measuring the contact resistance between the fixing portion 140 and the busbar 120, an abnormality in the current sensor 100 can be detected before a connection failure occurs in the electrical connection portion 130.

By increasing the contact area between the fixing portion 140 and the busbar 120, the stress applied to the fixing portion 140 is further dispersed. Therefore, a difference between a length (i.e., a width of the busbar portion 121 of the shunt resistor-integrated busbar 120) L1, in the Y axis direction, of the busbar portion 121 of the shunt resistor-integrated busbar 120 and a length L2, in the fixing portion 140 may be equal to or less than a first distance. In this case, the contact area between the fixing portion 140 and the busbar 120 can be increased, and the stress applied to the fixing portion 140 can be further dispersed. As a result, the chance of detachment of the fixing portion 140 can be reduced.

Figure 5:
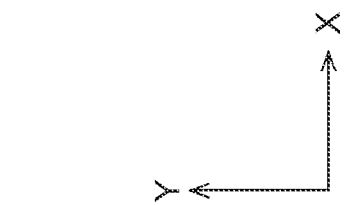
FIG. 5 is a view for explaining an arrangement of a circuit board 110 and the fixing portions 140.
Figure 5:
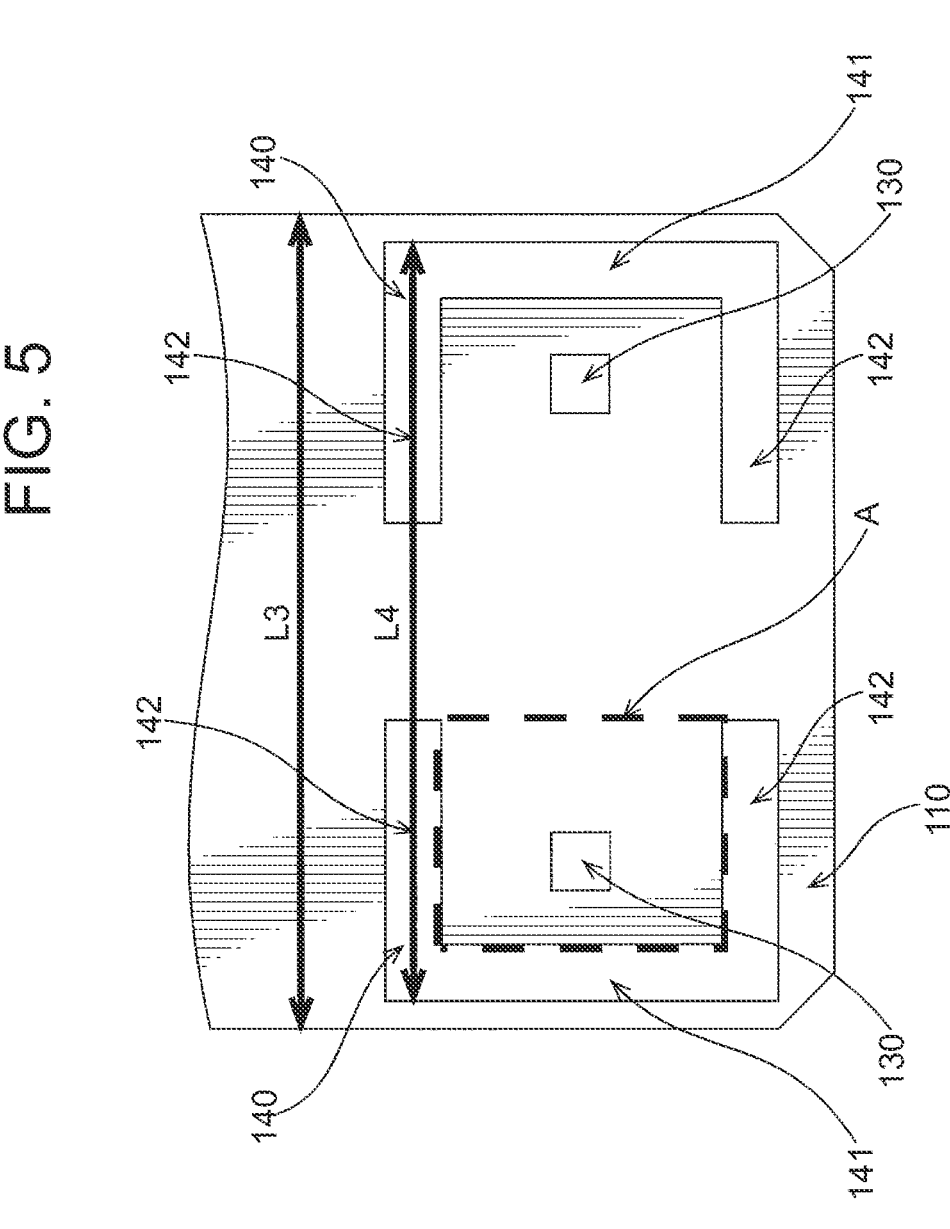

FIG. 5 is a view for explaining an arrangement of the circuit boards 110 and the fixing portions 140. By increasing the contact area between the fixing portions 140 and the circuit board 110, the stress applied to the fixing portions 140 is further dispersed. A difference between a length (i.e., a width of the circuit board 110) L3, in the X axis direction, of the circuit board 110 and a length L4, in the X axis direction, of the entirety of the two fixing portions 140 may be equal to or less than a second distance. In this case, the contact area between the fixing portion 140 and the circuit board 110 increases, and accordingly, the stress applied to the fixing portion 140 can be further dispersed. As a result, the chance of detachment of the fixing portions 140 can be reduced.

<Through Holes 111>

Figure 6:
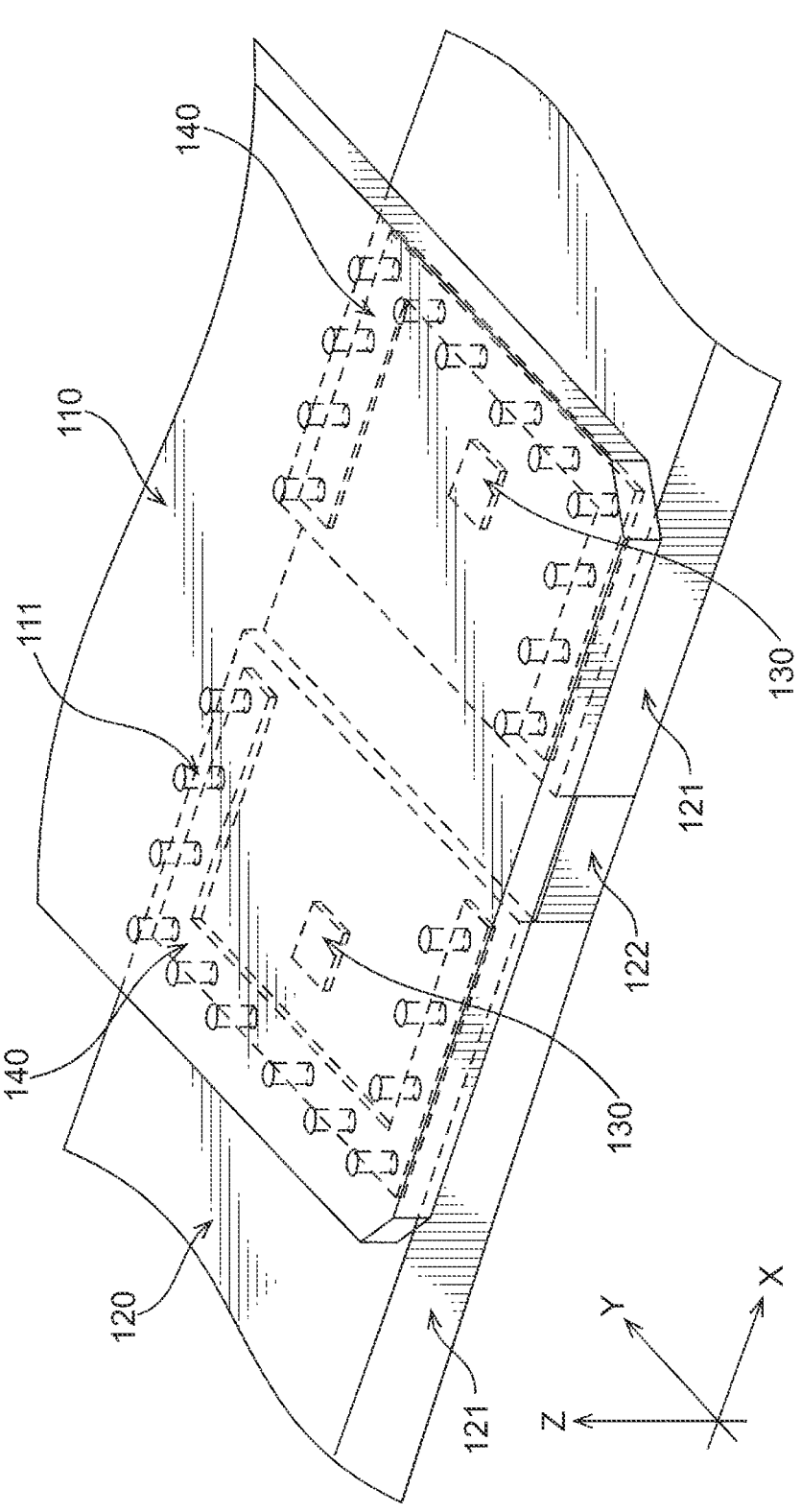
FIG. 6 is a view for explaining another example of a current sensor 100.

As illustrated in FIG. 6, the circuit board 110 may have through holes 111 into which at least portions of the fixing portions 140 may enter. In this case, the contact area between the fixing portion 140 and the circuit board 110 increases, and the stress applied to the fixing portions 140 is further dispersed. Furthermore, gas can escape from the through holes 111, and the chance of occurrence of voids in the fixing portions 140 can be reduced. Still furthermore, the state of suction of the material (solder) of the fixing portion 140 can be checked from the upper surface side of the circuit board 110, which makes it easy to judge whether the fixing state is good or not.

Figure 7:
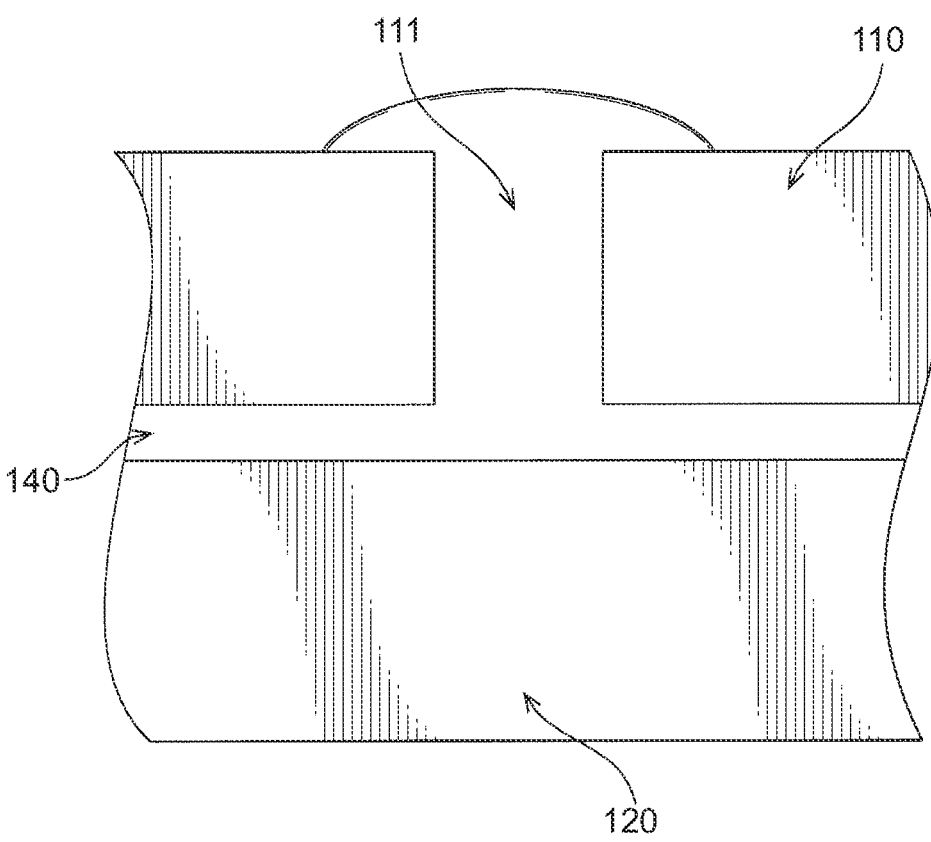
FIG. 7 is a view for explaining an example of relationship of a through hole 111 and the fixing portion 140.
Figure 8:
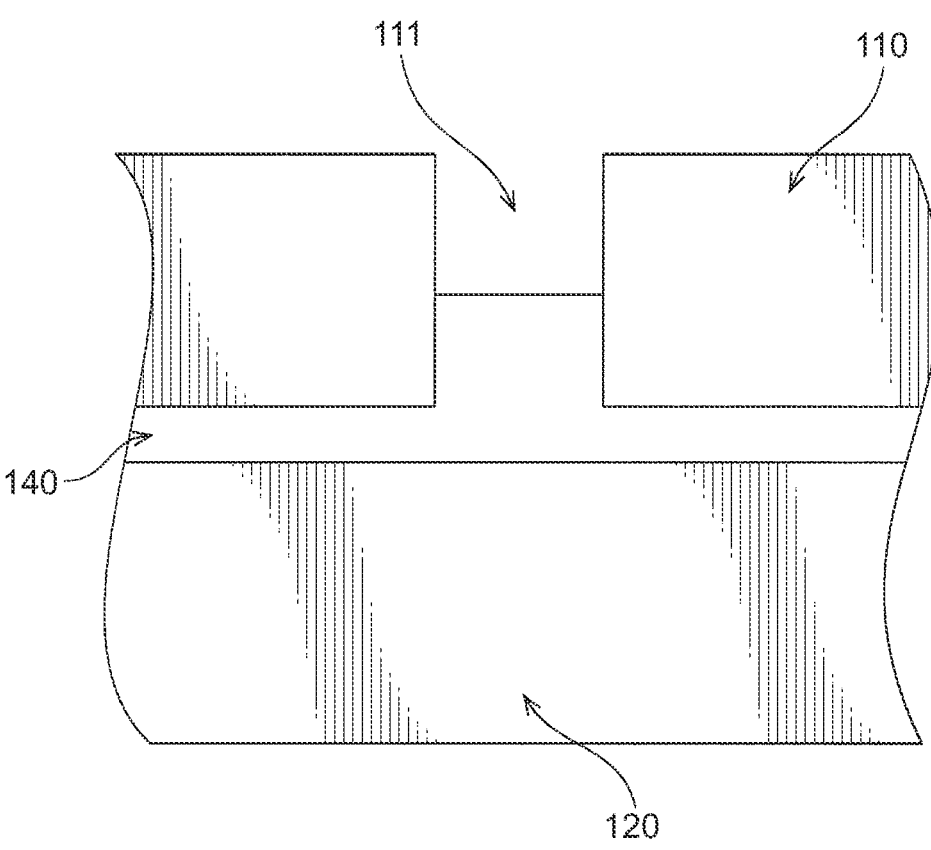
FIG. 8 is a view for explaining an example of relationship of the through hole 111 and the fixing portion 140

In this case, as illustrated in FIGS. 6 and 7, the entireties of the through holes 111 may be covered with the fixing portions 140, or alternatively, as illustrated in FIG. 8, only portions of the through holes 111 may be covered with the fixing portions 140. In this case, the above-described fixing patterns may be arranged on the entire inner surfaces of the through holes 111, or alternatively, the above-described fixing patterns may be arranged on only portions of the inner surfaces of the through holes 111.

In a case where the entireties of the through holes 111 are covered with the fixing portions 140, the lands of the fixing portions 140 are formed on the upper surface of the circuit board 110, as illustrated in FIGS. 6 and 7. In this case, the fixing portions 140 are in a rivet-like shape, so that the circuit board 110 is sandwiched between the fixing portions 140. As a result, with the anchor effect, the tensile strength of the fixing portions 140 is improved, which can further reduce the chance of detachment of the fixing portions 140. In this case, the above-described fixing patterns may be arranged around the through hole 111 on the upper surface of the circuit board 110.

If the material of the fixing portions 140 is solder, the solder can be sucked up to the upper surface of the circuit board 110 through the through holes 111 to forming lands by adjusting the amount of solder and flow conditions (temperature, time).

For the two fixing portions 140, a single through hole 111 may be provided, or multiple through holes 111 may be provided as illustrated in FIG. 6. In a case where multiple through holes 111 are provided for each of the fixing portions 140, for example, as illustrated in FIG. 6, the multiple through holes 111 may be arranged on both the portions corresponding to the first portions 141 of the fixing portions 140 and the portions corresponding to the second portions 142 of the fixing portions 140. In other words, as illustrated in FIG. 6, the multiple through holes 111 may be arranged in a U shape similarly to the fixing portions 140. In this case, the contact area between the fixing portion 140 and the circuit board 110 further increases, so that the stress applied to the fixing portions 140 is further dispersed.

Figure 9:
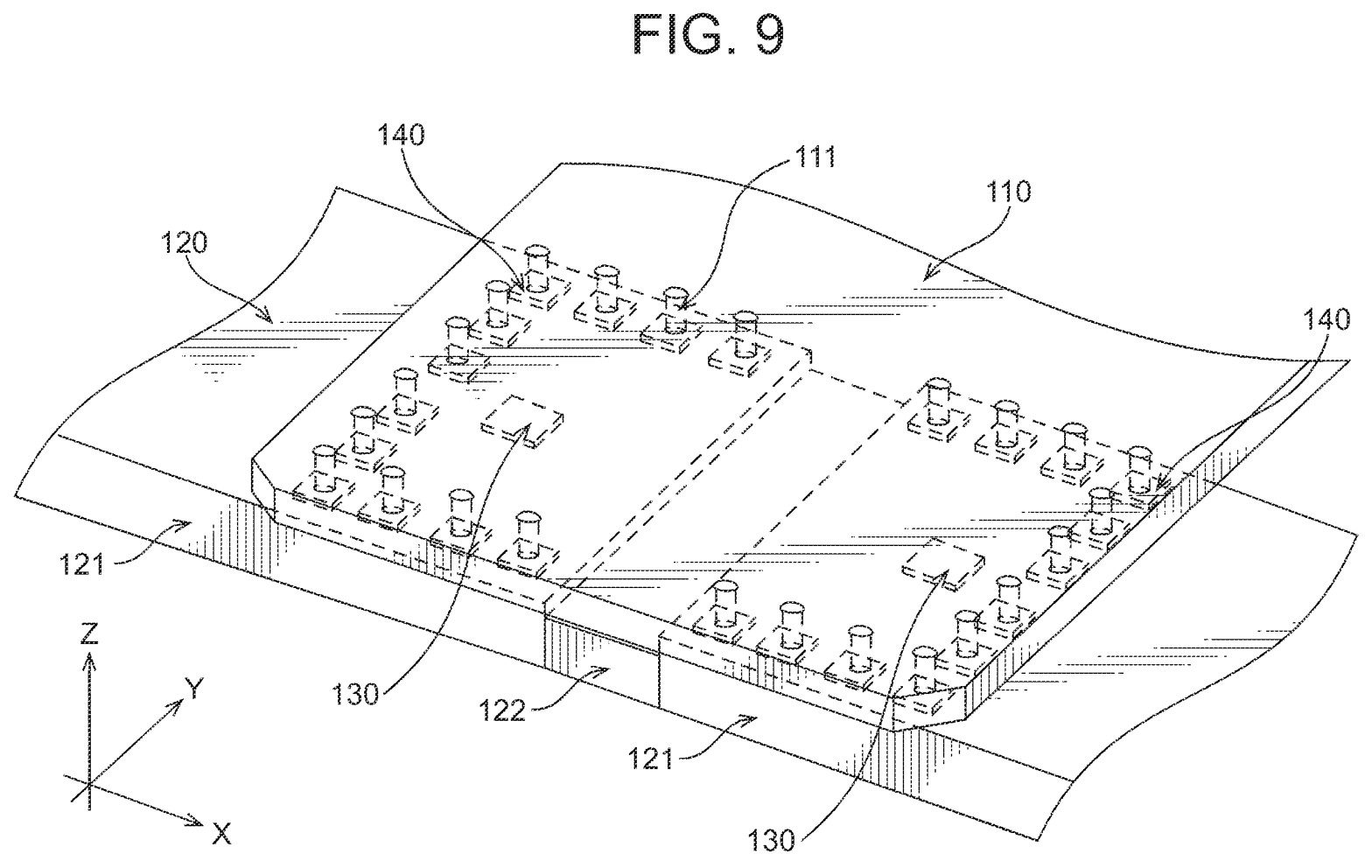

Furthermore, in a case where multiple through holes 111 are provided for each of the fixing portions 140, the fixing portions 140 may be divided into multiple parts that correspond to the respective through holes 111 in a one-to-one manner, as illustrated in FIG. 9. In this case, gas can escape also from the lower surface of the circuit board 110, and the chance of occurrence of voids in the fixing portions 140 can be further reduced.

Figure 10:
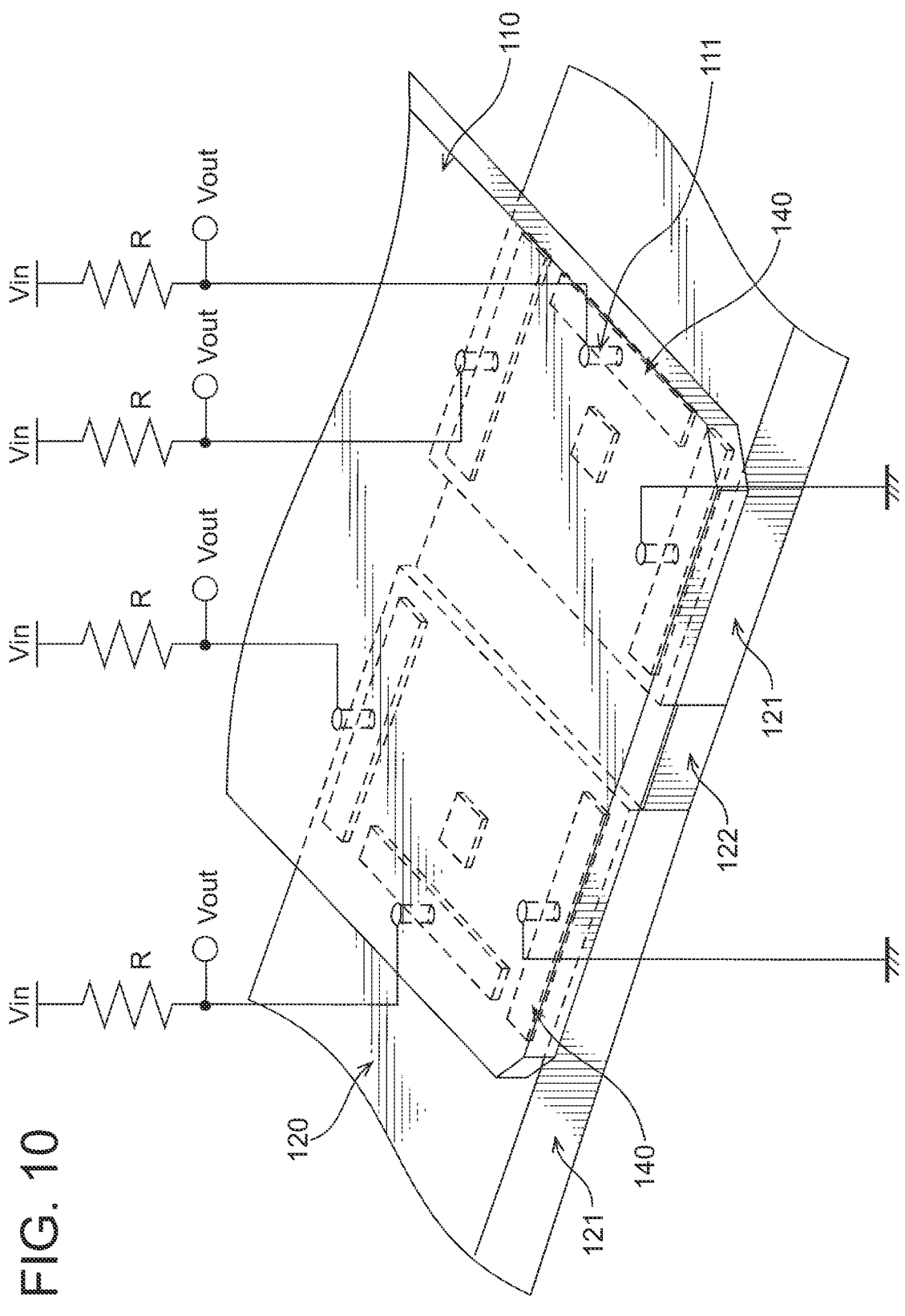
FIG. 10 is a view for explaining another example of the current sensor 100.

In this case, as illustrated in FIG. 10, on each of the two busbar portions 121, one of the multiple fixing portions 140 may be connected to a reference voltage, and another fixing portion 140 may be connected via a resistor R to a voltage source Vin. In this case, the contact resistance between the fixing portions 140 and the busbar 120 can be measured, and as a result, detachment of the fixing portions 140 may be detected based on the measurement of the contact resistance. On each of the fixing portions 140 connected via the resistor R to the voltage source Vin, the contact resistance between the fixing portions 140 and the busbar 120 increases in accordance with detachment of the fixing portion 140, i.e., in accordance with a decrease in the contact area between the fixing portion 140 and the busbar portion 121, so that a voltage value Vout between the fixing portion 140 and the resistor R increases.

Figure 11:
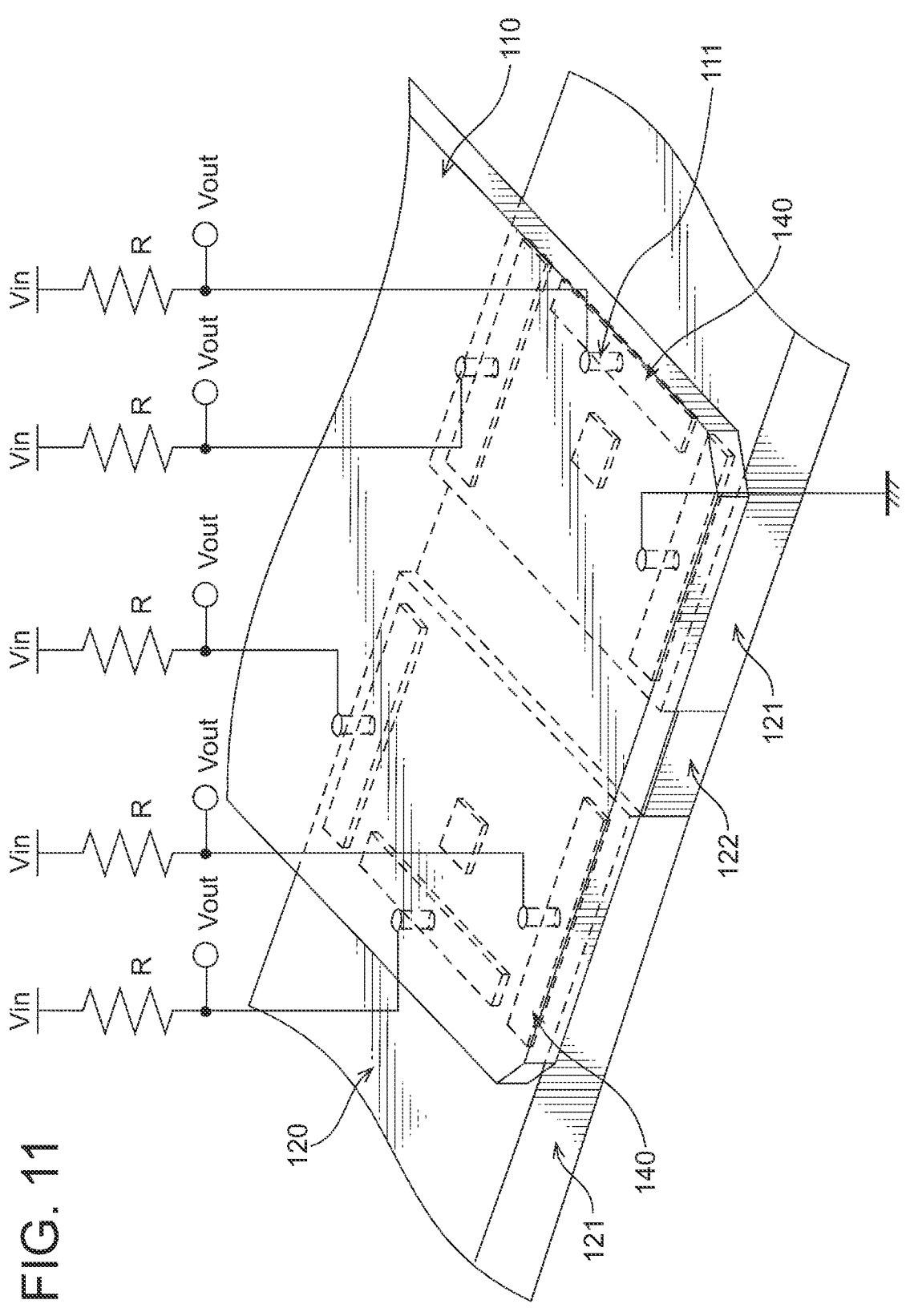
FIG. 11 is a view for explaining another example of the current sensor 100.

In the example as illustrated in FIG. 10, the fixing portions 140 connected to the reference voltage are present on both of the two busbar portions 121. Alternatively, as illustrated in FIG. 11, the fixing portion 140 connected to the reference voltage may be present on only one of the two busbar portions 121. Even in this configuration, the contact resistance between the fixing portions 140 and the busbar 120 can be measured.

The present invention has been described above with reference to preferred embodiment of the present invention. Although the present invention has been described herein with reference to specific examples, various modifications and changes can be made to these examples without departing from the spirit and scope of the invention as set forth in the claims.

LIST OF REFERENCE SIGNS 100 current sensor
110 circuit board
111 through hole
120 shunt resistor-integrated busbar
121 busbar portion
122 shunt resistor portion

6

130 electrical connection portion
140 fixing portion
141 first portion of fixing portion 140
142 second portion of fixing portion 140

What is claimed is:

1. A current sensor comprising:
a circuit board;
a shunt resistor-integrated busbar including two busbar portions and a shunt resistor portion connected between the two busbar portions;
electrical connection portions for electrically connecting conductive traces arranged on the circuit board and the busbar portions; and
a fixing portion for fixing the circuit board to the shunt resistor-integrated busbar,
wherein where a longitudinal direction of the shunt resistor-integrated busbar is defined as an X axis direction, and a width direction of the shunt resistor-integrated busbar is defined as a Y axis direction,
the fixing portion includes, on each of the two busbar portions:
a first portion extending in the Y axis direction; and
a pair of second portions extending toward the shunt resistor portion from both ends, in the Y axis direction, of the first portion, and
wherein the electrical connection portions are arranged between the second portions constituting the pair inside an area surrounded by the first portion and the second portions constituting the pair.

2. The current sensor according to claim 1, wherein a difference between a length, in the Y axis direction, of the busbar portion and a length, in the Y axis direction, of the fixing portion is equal to or less than a first distance.

3. The current sensor according to claim 1, wherein a difference between a length, in the X axis direction, of the circuit board and a length, in the X axis direction, of the entirety of the fixing portion is equal to or less than a second distance.

4. The current sensor according to claim 1, wherein the circuit board further includes a through hole into which at least a portion of the fixing portion enters.

5. The current sensor according to claim 4, wherein the fixing portion closes the entirety of the through hole.

6. The current sensor according to claim 5, wherein a land of the fixing portion is formed on one of surfaces of the circuit board on a side opposite to a side facing the shunt resistor-integrated busbar.

7. The current sensor according to claim 4, wherein the fixing portion closes a portion of the through hole.

8. The current sensor according to claim 4, wherein a plurality of through holes is provided, and
the plurality of through holes is arranged on both a portion corresponding to the first portion of the fixing portion and a portion corresponding to the second portion of the fixing portion.

9. The current sensor according to claim 4, wherein a plurality of through holes is provided, and
the fixing portion is divided into a plurality of parts that corresponds to the plurality of through holes in a one-to-one manner.

10. The current sensor according to claim 9, wherein one of the plurality of parts is connected to a reference potential, and other parts of the plurality of parts are connected via a resistor to a voltage source.

* * * * *